United States Patent [19]

Stoddard

[11] 3,943,451

[45] Mar. 9, 1976

[54] TV CHANNEL SELECTOR ASSEMBLY
[75] Inventor: James C. Stoddard, Wayland, Mass.
[73] Assignee: GTE Laboratories Incorporated, Waltham, Mass.
[22] Filed: June 26, 1975
[21] Appl. No.: 590,752

[52] U.S. Cl. ................ 325/464; 325/455; 325/459; 334/15
[51] Int. Cl.² .......................................... H03J 5/04
[58] Field of Search .......... 325/458, 459, 422, 455, 325/464, 465, 468, 335; 334/15, 14

[56] References Cited
UNITED STATES PATENTS
3,866,112  2/1975  Yokoyama et al. .................... 334/15
3,902,121  8/1975  Yoshino et al. ...................... 325/335

Primary Examiner—Robert L. Griffin
Assistant Examiner—Marc E. Bookbinder
Attorney, Agent, or Firm—Irving M. Kriegsman; Leslie J. Hart

[57] ABSTRACT

A TV channel selector assembly includes a keyboard having ten keys corresponding to the decimal numbers zero through nine, inclusive. The desired channel may be selected merely by activating the appropriately numbered keys, there being no other keys required to be activated to effect a channel change. After activation of the first key, which may be either a units digit channel or the tens digit of a two digit channel, a delay circuit defines a timed interval of about two seconds. Each keyboard output is encoded into a four digital word. A control device transfers the first digital word to a units channel input if a second key is not activated during the timed interval. If a second key is activated during the timed interval, the first digital word is transferred to a tens channel output, and the second digital word is transferred to the units channel output.

13 Claims, 2 Drawing Figures

TV CHANNEL SELECTOR ASSEMBLY

BACKGROUND OF THE INVENTION

The present invention relates to the art of TV channel selector assemblies and, more specifically, to an assembly having a numeric keyboard wherein the channel is selected by activating one or two keys corresponding to the desired channel number.

Numeric keyboard TV selector assemblies are not, per se, novel. Typically, the keyboard would include digits zero through nine inclusive for selecting any UHF or VHF channel. However in one known system, to change a channel of only one digit one has to first activate the "zero" key to set-up the control circuitry for the second digit. In another known system, the keyboard includes an "enter" key which must be activated prior to entering the selected channel. Both of these known systems have certain inconveniences. The control circuitry has added complexity, since three keys must be activated for a two digit channel and two keys must be activated for a single digit channel. Furthermore, the operator is inconvenienced by having to select a channel in an unnatural fashion.

To the knowledge of the inventor, no keyboard selector assembly is known of the type described and claimed herein.

SUMMARY OF THE INVENTION

It is an object of the present invention to provide a TV channel selector assembly which does not have a leading zero key or an enter key and in which the channel is selected merely by activating the appropriate key or keys corresponding to the channel number.

It is an additional object of the present invention to provide a TV channel selector assembly wherein if the operator becomes confused as to what channel has been entered, he may wait for a short time interval and then re-enter the desired channel number.

It is still an additional object of the present invention to provide a TV channel selector assembly having reduced complexity of electronic circuitry and which operates in a convenient fashion.

According to the present invention, there is provided a TV channel selector assembly of the type providing an output to a TV receiver, the output being effective to select an VHF or UHF channel. The assembly includes a keyboard having ten keys, each of which corresponds to one of the decimal numbers zero through nine inclusive. The keyboard provides a defined output corresponding to the particular one of the keys which is activated. A delay device responds to the activation of any key and defines a timed interval commencing after the activation of the key. A control device responsive to the selected key and the delay device, allocates the keyboard output as a units channel if a second key activation does not occur during the timed interval. Alternatively, the control assembly allocates the keyboard output as a tens channel if a second key activation occurs during the timed interval. In this case the second keyboard output becomes the units digit of the channel. The assembly is effective to select a channel by merely activating the key or keys corresponding to the channel number whereby no separate channel select control key is necessary. In operation, the operator of the assembly activates in a natural way the tens digit of a dual digit channel and then activates the units digit. The operator has a few seconds in which to activate the second key before the assembly interprets the first key activation as being the selection of a single digit channel.

There are several additional features in the preferred embodiment of the TV channel selector assembly. First, an encoder is preferably provided for encoding the keyboard output into a four bit digital word. Further, the assembly includes a visual display device for indicating the selected channel. Additional features are present in the control circuit for accomplishing the desired results with a minimum of electronic circuitry.

DESCRIPTION OF PREFERRED EMBODIMENTS

The purpose of this invention is to collect and display digits presenting TV channel numbers entered from a numeric keyboard by the television operator. The invention is useful in a number of applications of digital, all-channel control of varactor tuned TV receivers. These applications include direct frequency synthesis using a programable divider and phase-locked loop, beat counting methods using harmonics, and non-volatile storage of TV tuning voltages.

The TV selector logic assembly allows the operator to enter one or two digits depending on the desired channel number and not be required to enter a leading zero or push an enter key as in other systems. The first digit that is activated appears in the units position of the display and is transferred to the tens position if a second digit is entered. The second digit that is entered appears in the units position. A timed delay is initiated by entering the first digit. If this delay has not expired when the second digit is activated, the first digit is considered as a tens digit and the second digit is considered as the units digit. The collected data is transferred to the output which is fed to the TV set either when the second digit is entered or when the delay expires. The timed delay is of the order of a few seconds to allow the user to enter a second digit if needed.

Figure 1:
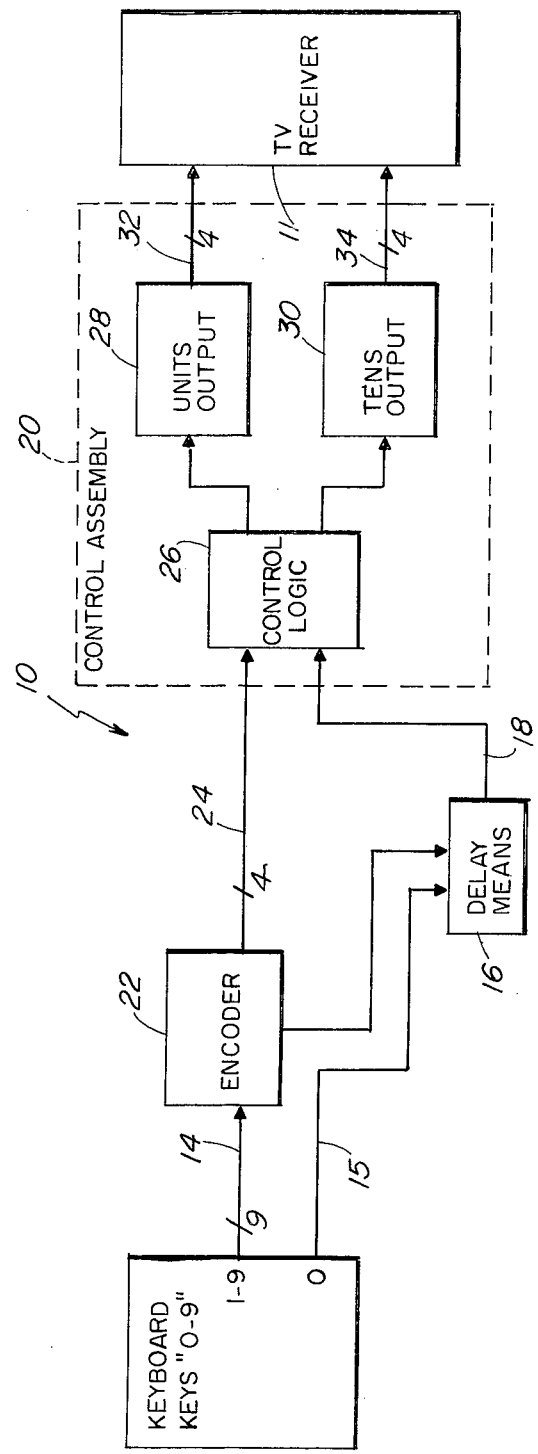
FIG. 1 is a block diagram of the keyboard selector assembly according to the present invention.

In an exemplary embodiment of the present invention, as illustrated in FIG. 1, there is provided a TV selector assembly, represented generally by the numeral 10, of the type providing an output to a TV receiver 11. The output is effective to select any VHF or UHF channel. The television 11 is of the type which includes digital all-channel control of varaetor tuned TV receivers. A keyboard 12 has ten keys, each of which corresponds to one of the decimal numbers zero through nine, inclusive. The keyboard 12 provides a defined output corresponding to the particular one of the keys which is activated. The keyboard output is represented generally by the reference numerals 14 and 15; the output 14 represents signals corresponding to the selection of digits "one" through "nine", inclusive, and the output 15 corresponds to selection of the digit "zero". The output 15, as shown, does not go to the control logic of the assembly. The control assembly automatically generates a zero for the tens digit if a second digit is not activated and senses a zero for a second digit selection since keys one through nine have not been selected. A delay means 16 responds to the activation of any key and defines a first timed interval via a line 18. A control assembly 20 responds to the keyboard output and the delay means output. This assembly allocates the keyboard output as a units channel if a second key activation does not occur during the timed interval or, alternatively, allocates the first keyboard output as a tens channel if a second key activation occurs during the timed interval, the second keyboard output then becomes the units channel.

Preferably, the selector assembly 10 includes an encoder 22 which responds to the keyboard output 14 for encoding each activated key into a four bit digital word. Thus, an output 24 from the encoder 22 is a four bit digital word; preferably, the control assembly 20 includes a control logic 26 which channels the various four bit digital words to either a units output device 28 or a tens output device 30. The output lines of the units and tens devices to the TV receiver 11 are designatd 32 and 34 respectively. In operation if a single digit number is selected, the units output 32 is a four bit digital word corresponding to the coded value, and the tens output is a four bit digital word equal to zero. If a two digit channel has been selected, the tens output is a four bit digital word corresponding to the first selected key, and the units digit output is a four bit digital word corresponding to the second selected key. The encoder 22 is a nine bit to four bit encoder; for example, if the channel nine is selected, the encoder output 24 would have a logic one in the least significant bit line and the most significant bit line and a logic zero on the second and third bit line. The delay means 16 is activated when any of the ten keys is selected.

Figure 2:
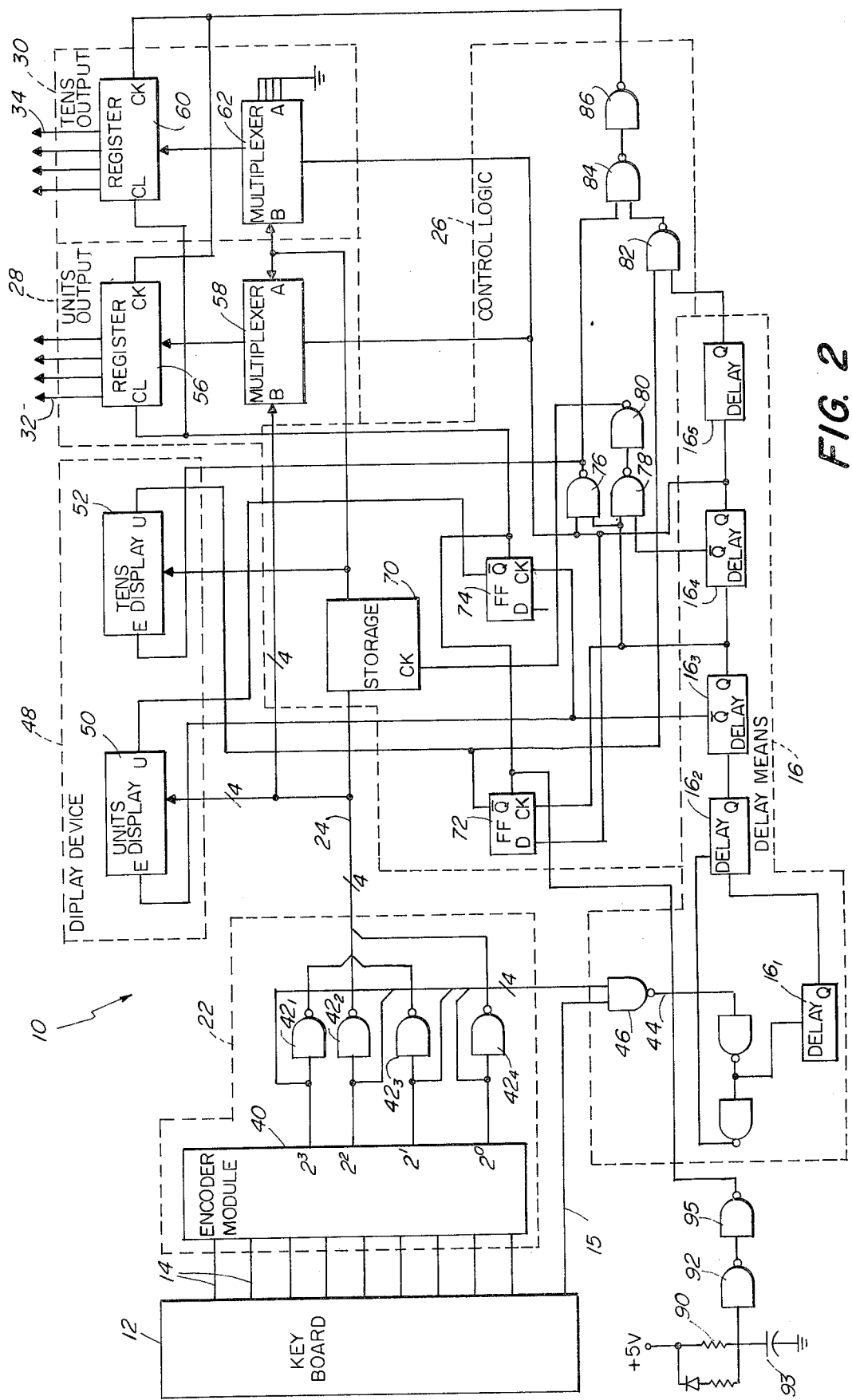
FIG. 2 is a more detailed diagram of the TV channel selector assembly.

Referring now to FIG. 2, there is provided a more detailed diagram of the preferred embodiment of the present invention. The encoder 22 may include an encoder module 40, such as one commercially available and designated SN74147, and a group of NAND gates $42_1$ through $42_4$ for inverting the encoder module outputs to make them compatable with the remaining portion of the logic. The NAND gates outputs are combined to form the output 24 which is directed to the control logic 26. An output 44 from a NAND gate 46 provides a logic one whenever any one of the ten keys is activated.

Preferably, a display device 48 is provided for visual indication of the selected channel. The device 48 includes a unit display 50 and a tens display 52. One suitable component for the display is a LED display module commercially available as SN7340. Each of the displays 50 and 52 has an enable input designated "E" and an unblanking input designated "U".

As stated previously, the control assembly in FIG. 2 includes a units output 28, the tens output 30 and the control logic 26. The units output 28 includes an output register 56 and a data multiplexer 62. One suitable output register is commercially available device designated SN74174, having a clear input, designated CL, and a clock input designated CK. One suitable data multiplexer is a device designated SN74157 having an A and B input section. The A input of the data multiplexer 62 is provided with a grounded input on each line so that that section is loaded with logic zeros.

The delay means 16 includes a group of one shot devices designated $16_1$, $16_2$, $16_3$, $16_4$, and $16_5$. The control logic 26 includes a temporary storage register 70 (such as SN 74174), a pair of flip-flops 72 and 74 (SN7474), and NAND gates 76, 78, 80, 82, 84, and 86.

Referring now to the operation of the embodiment shown in FIG. 2, a network 90 is connected at an arrangement of NAND gates 92 and 95. The network 90 charges the capacitor 93 when the power is turned on with a delay and provides a high output from the NAND gate 92 for a short time after power turn on. Then the NAND gate 95 provides the proper polarity for power turn on initialization of the system. The flip-flops 72 and 74, as well as the output register 56 and 60, are reset by the outputs of NAND 95.

The keyboard 12 is connected such that one line on this output is grounded when a key is activated. The NAND gates 46 produce a logic one output when any key is activated. The inputs to this NAND gate are the inverted states of the key activation. For example, when no key is activated all inputs are logic one giving a zero output. When an input goes to a zero, the output goes to one. A positive going transition from the output 44 of the NAND gate 46 triggers the delay chain of one shot circuits. The delay circuit $16_1$ prevents contact bounce on release of a key from retriggering the delay circuit $16_2$. The delay circuit $16_2$ allows contact bounce when a key is depressed to subside and the code outputs of the encoder module 40 to become stable before further action occurs. The output of the delay circuit $16_3$ is a short pulse which enters the encoded and inverted data via the gates 42 into the units display 50 of the display device 48, and the flip-flop 74 on the trailing edge. Since on the first entry the delay device $16_4$ has not been fired, there is a logic one at the output of the NAND gate 80 that loads the encoded and inverted keyboard data into the temporary storage register 70. The output of the NAND gate 76 remains a logic one and the tens display 50 is not loaded (since the E input requires a logic zero) and no clock is applied to the output storage registers 56 and 60.

The flip-flop 74 output (i.e. a logic one) unblanks the units LED display 50, permitting the operator to see his first entered digit. The delay $16_4$ is triggered from the trailing edge of the pulse from the delay device $16_3$. The delay $16_4$ is the timed delay which permits the user to enter a second digit for two digit channel numbers.

If no second digit is entered, no action happens until the delay $16_4$ expires which triggers the delay $16_5$. A pulse is fed through the NAND gates 82, 84, and 86 to load the output registers 56 and 60. These registers are loaded from the output of the data multiplexers 58 and 62. For the condition of a single input digit, the data multiplexer 58 selects the A input from the storage device 70 and the data multiplexer 62 selects all zeros and the proper data is made available to the TV set. (How do they know whether to select the A or B words)

If within the time that the delay device $16_4$ is fired a second digit is entered, thereby triggering the delay chain starting with the delayed device $16_2$ again, then the flip-flop 72 is set, unblanking the ten display 52, and a pulse from the NAND gate 76 loads the encoded and the inverted keyboard data into the tens display 52 as well as generating a load pulse for the output register 56 and 60 through the NAND gates 84 and 86. The data fed to the output register is selected from the B inputs of the multiplexers 58 and 62. This data is the stored first digit for the tens digit and the encoded and inverted keyboard data for the units digit.

Once the system has been used to select a channel, the operation is the same as from the power on clear state except the flip-flop 72 is reset, thereby blanking the tens display 52 when the first key is activated.

In the preferred embodiment, the delay devices 16 are all commercially available one shot circuits, such as those designated SN74121. One skilled in the art shall be able to use the appropriate values of resistance and capacitance with these one shot circuits to obtain the desired delay time. The following is a list of the preferred delay times generated through these devices.

| | |
|---|---|
| $16_1$ | 15 milliseconds |
| $16_2$ | 10 milliseconds |
| $16_3$ | 1 microsecond |
| $16_4$ | 2 seconds |
| $16_5$ | 1 microsecond |

The embodiments of the present invention are intended to be merely exemplary and those skilled in the art shall be able to make numerous variations and modifications of them without departing from the spirit and scope of the present invention. For example, the delay time of the delay $16_4$ may be any variation which is long enough to allow the operator time to select a second key. All such variations and modifications are intended to be within the scope of the present invention as defined by the appended claims.

I claim:

1. A TV channel selector assembly of the type providing an output to a TV receiver, the output effective to select any VHF or UHF channel, including:
   a. a keyboard having ten keys each of which corresponds to one of the decimal numbers zero through nine inclusive, the keyboard providing a defined output corresponding to the particular one of the keys which is activated,
   b. delay means responsive to the activation of any key for defining a first timed interval commencing after the activation of any key, and
   c. control means responsive to the keyboard output and the delay means for allocating the keyboard output as a units channel if a second key activation does not occur during the timed interval and for allocating the keyboard output as a tens channel if a second key activation occurs during the timed interval, the second key activation forming a second keyboard output which is allocated as a units channel, the assembly selecting and changing channels by activating the numbered keys corresponding to the desired channel.

2. The selector assembly according to claim 1 further including an encoder responsive to the activation of the keys for encoding each keyboard output into a four bit digital word.

3. The selector assembly according to claim 2 further including a display means responsive to the digital words and the control means for visually displaying the decimal number corresponding to the selected channel.

4. The selector assembly according to claim 3 further including means responsive to the activation of the keys for initiating the timed interval wherever any key is activated.

5. The selector assembly according to claim 4 wherein the delay means includes means for defining a second timed interval preceding the first timed interval for allowing contact bounce from the key to subside.

6. The selector assembly according to claim 5 wherein the control means includes
   a. a storage register sequentially receiving the digital words from the encoder,
   b. a units and tens multiplexer each having a first and second word storage device, the units multiplexer storing the same digital word in each storage device, the tens multiplexer storing the digital word in the first storage means and a digital word equal to zero in the second storage device,
   c. a units and a tens output register receiving the outputs of the units and tens multiplexer and for transferring the outputs in response to a transfer signal, and
   d. a means for transferring after the first timed interval the digital words in the first storage devices of the multiplexers to the respective output registers if a key is not activated during the first timed interval and for transferring the digital words in the second storage devices to the output register if a key is activated during the first timed interval.

7. The selector assembly according to claim 6 wherein the first timed interval is of a duration effective to allow the operator to select another key after selecting a first key.

8. The selector assembly according to claim 7 wherein the interval is about 2 seconds.

9. The selector assembly according to claim 6 further including means for displaying the units number if the key is not activated during the first timed interval and for displaying the units and display if displayif a key is activated during the first timed interval.

10. The selector assembly according to claim 6 wherein the control means includes a first and second flip-flop and further including means responsive to initialization of electrical power for resetting the flip-flops and the output registers.

11. The selector assembly according to claim 1 wherein the delay means is a one shot circuit.

12. The selector assembly according to claim 10 wherein the control means further includes
   a. means responsive to the end of the second timed interval for setting the first flip-flop, loading the storage register with the first digital word and the first and second storage of the device units multiplexer and the second storage device of the tens multiplexer and displaying the first digital word in units display means,
   b. means responsive to the end of the first timed interval without receipt of a second key activation for loading the contents of the first storage devices of the units and tens multiplexer into the respective output registers and
   c. means responsive to the receipt of a second key activation during the first timed interval for setting the second flip-flop, loading the second storage device of the units multiplexer with the second digital word, displaying the second digital word in the units display means, displaying the first digital word in the tens display means and loading the contents of the second storage devices of the multiplexers into the respective output registers.

13. The selector assembly according to claim 12 wherein the delay means include
   a. a first one shot circuit defining a 15ms delay,
   b. a second one shot circuit triggered by the first one shot and defining a 10ms delay, the two delays forming the second defined timed interval, a third one shot circuit triggered by the second one shot and defining a 1ms delay, a fourth one shot circuit triggered by the third one shot and defining the first timed interval and a fifth one shot circuit triggered by the fourth one shot and definfing a 1$\mu$s delay.

* * * * *

UNITED STATES PATENT OFFICE
CERTIFICATE OF CORRECTION

Patent No. 3,943,451    Dated March 9, 1976

Inventor(s) James C. Stoddard

It is certified that error appears in the above-identified patent and that said Letters Patent are hereby corrected as shown below:

Column 2, line 52, delete "varaetor" and insert --varactor--;
Column 3, line 8, delete "becomes" and insert --becoming--;
Column 3, line 17, delete "designatd" and insert --designated--;
Column 4, lines 51 and 52, delete "(How do they know whether to select the A or B words)";
Claim 8, second line, before "interval" insert --first timed--;
Claim 9, fourth line, after "and" insert --tens--, and after "if" delete "displayif";
Claim 12, fifth line, delete "with the first digital word"; sixth line, delete "of the" and after "device" insert --of the--; eighth line, after "multiplexer" insert --with the first digital word--;

Signed and Sealed this twenty-second Day of June 1976

[SEAL]

Attest:

RUTH C. MASON
Attesting Officer

C. MARSHALL DANN
Commissioner of Patents and Trademarks

REEXAMINATION CERTIFICATE (1266th)
United States Patent [19]
Stoddard

[11] B1 3,943,451
[45] Certificate Issued May 8, 1990

[54] TV CHANNEL SELECTOR ASSEMBLY

[75] Inventor: James C. Stoddard, Wayland, Mass.

[73] Assignee: GTE Laboratories Incorporated

Reexamination Request:
No. 90/001,784, Jun. 13, 1989

Reexamination Certificate for:
Patent No.: 3,943,451
Issued: Mar. 9, 1976
Appl. No.: 590,752
Filed: Jun. 26, 1975

[51] Int. Cl.$^5$ .................................. H04B 11/16
[52] U.S. Cl. ........................... 455/158; 455/179; 334/15
[58] Field of Search .............. 455/151, 179, 180, 158, 455/188, 191, 352; 358/194.1

[56] References Cited
U.S. PATENT DOCUMENTS
3,955,145  5/1976  Kawashima .................. 455/180

*Primary Examiner*—Reinhard J. Eisenzopf

[57] ABSTRACT

A TV channel selector assembly includes a keyboard having ten keys corresponding to the decimal numbers zero through nine, inclusive. The desired channel may be selected merely by activating the appropriately numbered keys, there being no other keys required to be activated to effect a channel change. After activation of the first key, which may be either a units digit channel or the tens digit of a two digit channel, a delay circuit defines a timed interval of about two seconds. Each keyboard output is encoded into a four digital word. A control device transfers the first digital word to a units channel input if a second key is not activated during the timed interval. If a second key is activated during the timed interval, the first digital word is transferred to a tens channel output, and the second digital word is transferred to the units channel output.

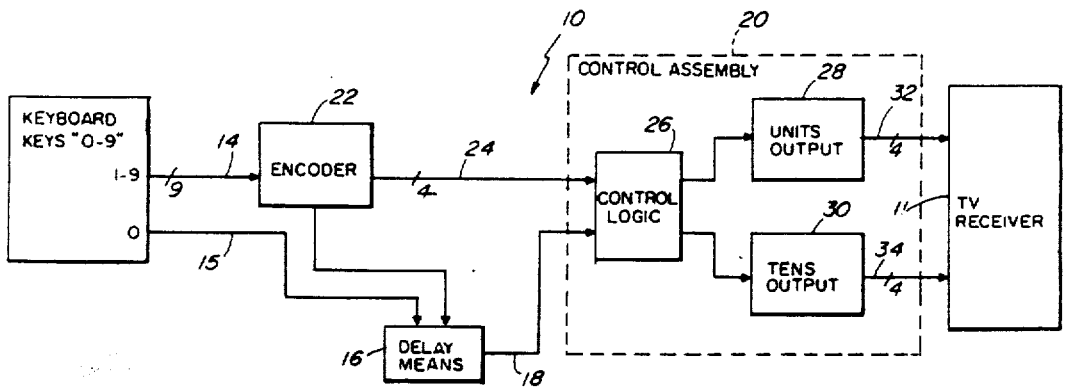

REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1–13 is confirmed.

Claims 12 and 13 were not reexamined.

* * * * *